United States Patent

Korbonski

[11] Patent Number: 5,961,255
[45] Date of Patent: Oct. 5, 1999

[54] ENTRY OVERLAY SHEET AND METHOD FOR DRILLING HOLES

[75] Inventor: John A. Korbonski, San Juan Capistrano, Calif.

[73] Assignee: Systems Division Incorporated, Irvine, Calif.

[21] Appl. No.: 09/121,978

[22] Filed: Jul. 24, 1998

Related U.S. Application Data

[63] Continuation-in-part of application No. 08/688,362, Jul. 30, 1996, Pat. No. 5,785,465.

[51] Int. Cl.$^6$ .............................. B23B 35/00; B23B 41/00
[52] U.S. Cl. ................................................ 408/1 R; 408/87
[58] Field of Search ................... 408/1 R, 72 R, 408/87, 95, 97

[56] References Cited

U.S. PATENT DOCUMENTS

| | | | |
|---|---|---|---|
| 3,700,341 | 10/1972 | Block | 408/1 R |
| 4,019,826 | 4/1977 | Block | 408/1 R |
| 4,269,549 | 5/1981 | Block | 408/1 R |
| 4,311,419 | 1/1982 | Block | 408/1 R |
| 4,605,344 | 8/1986 | Hartmann | 408/95 |
| 4,781,495 | 11/1988 | Hatch et al. | 408/1 R |
| 5,067,859 | 11/1991 | Korbonski | 408/1 R |
| 5,082,402 | 1/1992 | Gaku et al. | 408/1 R |
| 5,480,269 | 1/1996 | Ejiri et al. | 408/1 R |
| 5,507,603 | 4/1996 | Nakano et al. | 408/1 R |
| 5,716,168 | 2/1998 | Janoff | 408/87 |
| 5,785,465 | 7/1998 | Korbonski | 408/87 |

*Primary Examiner*—Daniel W. Howell
*Attorney, Agent, or Firm*—Larry K. Roberts

[57] ABSTRACT

An overlay sheet having a first thin layer of a polymer material, a second thin layer of a hard material such as a phenolic, melamine or metal foil, and a third thin layer of a polymer material, the first and third layers sandwiching the second layer. The sheet is applied to a surface of a printed circuit board such that the third layer is against the board surface, and the first layer is exposed to receive the drill bit. During drilling operations, the drill bit is advanced initially through the softer first layer of the polymer material, immobilizing the tip of the drill bit against lateral movement, then through the harder layer, then through the softer third layer, and finally through the printed circuit board. The harder layer prevents formation of burrs, and the polymer material inhibits drill bit wander.

26 Claims, 2 Drawing Sheets

5,961,255

ENTRY OVERLAY SHEET AND METHOD FOR DRILLING HOLES

CROSS-REFERENCE TO RELATED APPLICATION

This application is a continuation-in-part of application Ser. No. 08/688,362, filed Jul. 30, 1996 now U.S. Pat. No. 5,785,465.

TECHNICAL FIELD OF THE INVENTION

This invention relates to the fabrication of printed circuit boards, and more particularly to an improved entry overlay sheet and method for drilling micro-holes and larger holes.

BACKGROUND OF THE INVENTION

Applicant's U.S. Pat. No. 5,067,859, the entire contents of which are incorporated herein by this reference, describes a method for drilling small holes in printed circuit boards. This invention is an improvement over the invention described in this issued patent. The '859 patent describes the use of an entry overlay sheet which is a homogeneous layer comprising a polymer material having a thickness of about ten thousandths of an inch or smaller. While this sheet works very well in the drilling of micro-sized holes, on the order of 0.003 to 0.005 inches in diameter, the ability to drill larger holes, say on the order of 0.005 to 0.015 inches, is impaired, due to the flexibility of the thin overlay sheet. The layer of polymer material will help to minimize the drill wander, but does not prevent formation of burrs in holes drilled with larger drill sizes. The polymer film overlay material, with its inherent softness and lack of rigidity, tends to lift off the surface of the drilled laminate with the return stroke of the drill. Such lift-off may cause collecting of debris under the drill entry overlay sheet.

SUMMARY OF THE INVENTION

It is therefore an object of this invention to provide an improved entry overlay sheet and method for drilling holes in a printed circuit board which is suitable for drilling of micro- and larger holes.

A method is described for drilling a printed circuit board, comprising the steps of:

placing an entry overlay sheet on a surface of the printed circuit board, wherein the entry overlay sheet comprises a first thin layer comprising a polymer material having a thickness of about ten thousandths of an inch or smaller, a second thin layer of a hard material, and a third thin layer comprising a polymer material having a thickness of about ten thousandths of an inch or smaller, with the first layer and the third layer sandwiching therebetween the second layer; and drilling through the first thin layer, the second thin layer, the third thin layer and the printed circuit board in succession with a drilling tool.

In accordance with another aspect of the invention, an entry overlay sheet is described for facilitating drilling of holes in printed circuit boards. The entry overlay sheet includes a first thin layer of a polymer material having a thickness of about ten thousandths of an inch or smaller, a second thin layer of a hard material having a thickness of about twelve thousandths of an inch or smaller, and a third thin layer of a polymer material having a thickness of about ten thousandths of an inch or smaller. The first thin layer and third thin layer sandwich the second layer, the third layer for application against the surface of the printed circuit board.

BRIEF DESCRIPTION OF THE DRAWING

These and other features and advantages of the present invention will become more apparent from the following detailed description of an exemplary embodiment thereof, as illustrated in the accompanying drawings, in which.

DETAILED DESCRIPTION OF THE PREFERRED EMBODIMENT

Figure 1:
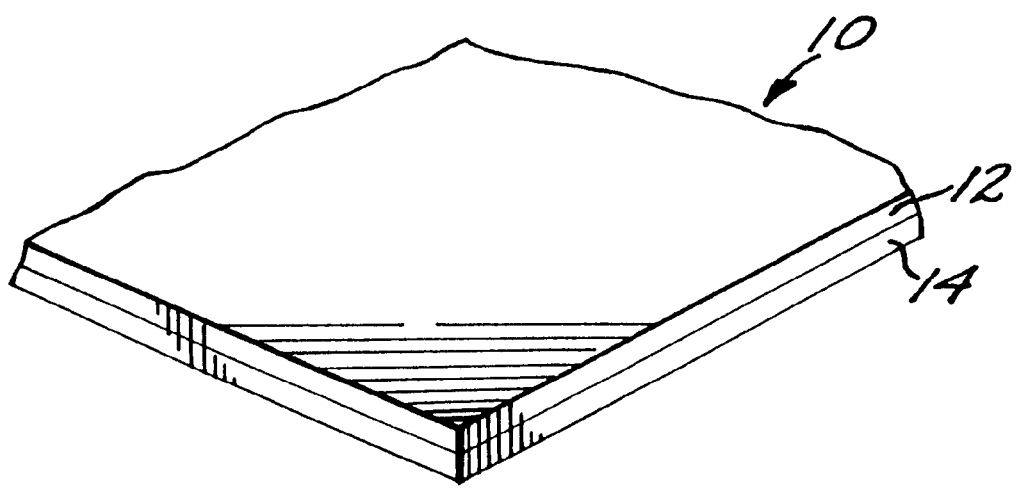
FIG. 1 illustrates an improved entry overlay sheet in accordance with this invention.

FIG. 1 illustrates an exemplary embodiment of an improved entry overlay sheet 10 in accordance with the invention. The sheet 10 comprises a thin layer 12 of homogeneous polymer material selected from the thermoset or thermoplastic families of resins which can be fabricated in sheet form. The layer 12 is in turn applied to a relatively hard layer 14, e.g. a layer of non-metallic material such as a phenolic or melamine (thermoset resins), to create an entry overlay sheet which is stiffer than that described in U.S. Pat. No. 5,067,859. Melamine is a chemical name for an amino resin made from urea and ammonia. Phenolic and melamine resins are both thermoset resins which do not melt at elevated temperatures, but rather will turn to powder. The melamine resin is available commercially, e.g. from American Standard. The layer 14 could be alternatively fabricated of a metal material, such as aluminum or copper foil.

The improved overlay sheet 10 can be used advantageously both in micro-hole drilling and drilling with larger drill sizes. The layer 12 provides a soft entry for the drill tool, and immobilizes, in a lateral direction sense, the tip of the drill prior to entering the harder layer 14, i.e. the layer 12 prevents the tip of the drill from deflecting along directions transverse to the drill axis.

The layer 12 has a preferred thickness in the range of 3 to 8 thousandths (0.003 to 0.008) of an inch. The hard layer 14 has a preferred thickness in the range of 3 to 12 thousandths of an inch. Thus, exemplary embodiments of the overlay sheet 10 will have a preferred composite thickness in the range of 6 to 20 thousandths (0.006 to 0.020) of an inch.

The preferred embodiment employs a phenolic or melamine layer 14, and may be fabricated in the following manner. Phenolic or melamine is typically made by passing a sheet/web of paper through a liquid phenolic or melamine bath, with the excess resin material removed by rollers or squeegees. The resulting paper is impregnated with the phenolic or melamine resin, and is dried in an oven. This leaves the paper web with resin in a somewhat flexible, non-cured state, i.e. the resin has not yet polymerized. The paper is then cut into sheets which are stacked between separator plates to form a lamination. This lamination is then placed in a heated press to cure at an elevated temperature. After a subsequent cooling stage, the curing step results in a final, phenolic or melamine product. To fabricate the entry overlay sheet embodying this invention, the soft layer 12 can be bonded to the phenolic or melamine sheet during the second curing step. A preferred material for the layer 12 is nylon, which is stable to 500 degrees F. The soft nylon layer is placed on each uncured phenolic sheet prior to the hot press step. During the hot press step, the nylon becomes adhered to a surface of the phenolic/melamine as the latter sheet is curing. This will result in the sheet 10. The nylon layer may be coated with a primer to enhance adhesion.

In an alternate embodiment, the layer 14 is a metal foil layer. The polymer layer 12 can be affixed to the hard metal foil layer 14 with an adhesive. There are many types of adhesives which can be used for this purpose. The selection is guided by the mechanical and thermal properties of the adhesive, as it is important that the adhesive will not melt during the drilling process and adhere to the drill bit. Alternatively, the layer 12 can be laminated to the foil layer 14 with heat, or the layer 12 can be extruded and bonded to the layer 14 in one operation. Most films are calendared, wherein a steel drum is coated with a molten polymer material. The metal foil can be placed on the drum, pretreated to assure bonding of the foil and molten polymer, and coated with the molten material.

Thin sheets of the polymer layer 12 can be made through casting, extruding, calendaring or pressing methods currently used to fabricate polymer films. Examples of thermoplastic materials believed suitable for fabricating the layer 12 include nylon, cellulose triacetate, polyester, polyimid, polyetherimid, and polycarbonate. One example of a thermoset material which may be used to fabricate the layer 12 is FR-4 resin formed into a thin sheet. The surface finish of the layer 12 can be either mat or smooth, free of pits, voids or dents. The material comprising the layer 12 is ideally free of pin holes. The cost of the material is an important factor, to minimize the cost of the entry overlay sheet.

A plastic sheet to be used as layer 12 can be formed from a liquid bath of resin. To assure homogeneity and flatness of the finished product, an extrusion of the melted material through calendaring machines is a preferred technique for making the film. Calendaring is accomplished by passing the molten material through opposing rollers until a desired thickness is formed.

The fabrication of phenolics, melamines and metal foils such as aluminum foil or copper foil is well known.

Figure 2:
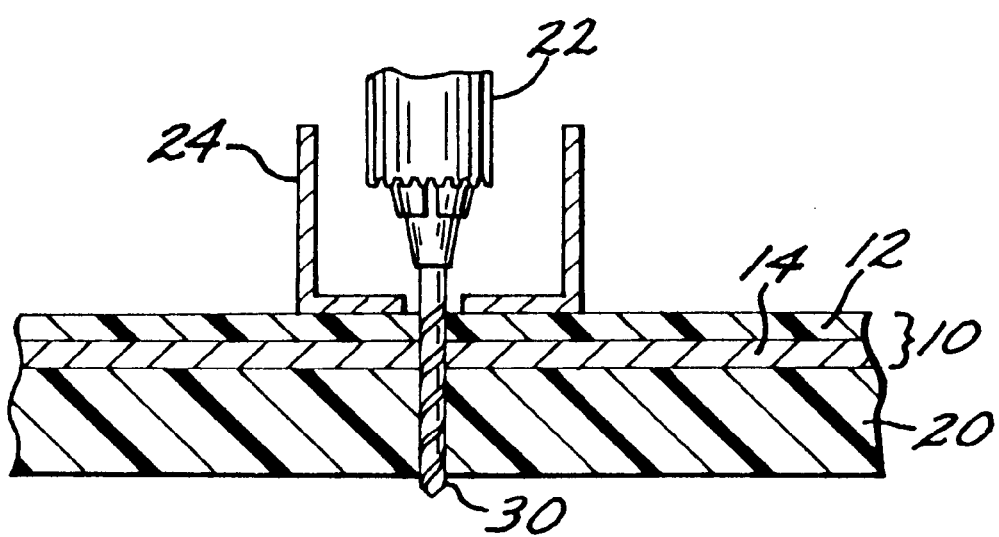
FIG. 2 illustrates the drilling of a hole in a printed circuit board employing the improved entry overlay sheet in accordance with the invention.

FIG. 2 illustrates a method of drilling a printed circuit board 20 employing the entry overlay sheet 10 in accordance with the invention. The drill bit 30 is carried by a drilling spindle 22, which typically includes a pressure foot 24. With the entry overlay sheet 10 placed on top of the printed circuit board 20, with the polymer film 12 exposed, the spindle 22 and pressure foot 24 are lowered, the pressure foot 24 contacting the exposed surface of the layer 12 and securing it, and the rotating drill bit 30 is lowered or advanced into the material to be drilled. The layer 12, layer 14 and then the printed circuit board 20 are drilled in succession.

Figure 3:
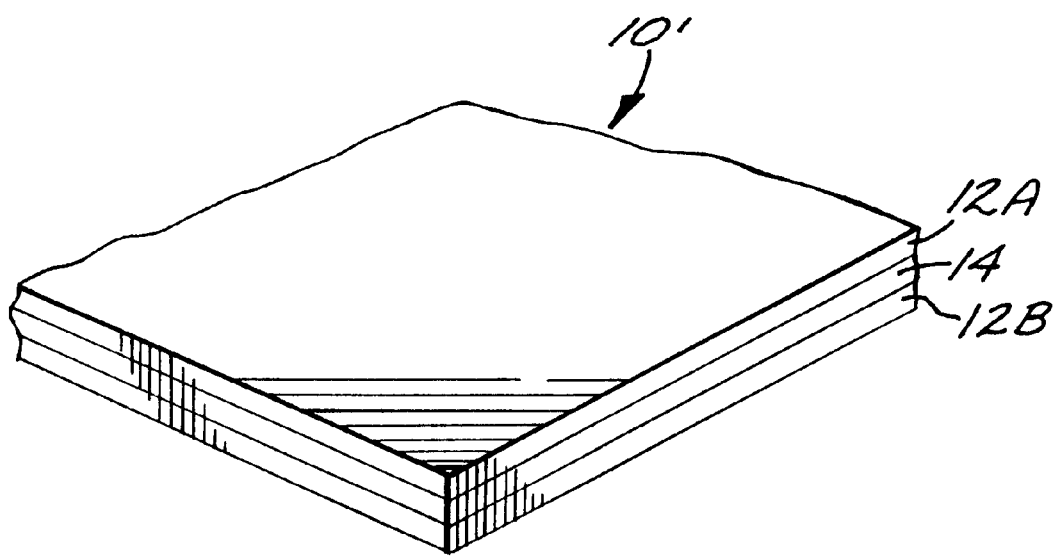
FIG. 3 shows an alternate embodiment of an improved entry overlay sheet in accordance with the invention.

FIG. 3 illustrates an alternate embodiment of an entry overlay sheet 10' in accordance with the invention. The sheet 10 of FIG. 1 has an "up" side and a "down" side relative to the printed circuit board, in that the layer 12 is positioned to first receive the drill tool. The sheet 10' is "reversible" in the sense that either side can be positioned against the printed circuit board. This is accomplished by providing the sheet 10' with layers 12A and 12B which sandwich layer 14. In an exemplary embodiment, the layers 12A and 12B are identical to layer 12 (FIG. 1), and thus are each thin layers of a homogeneous polymer material selected from the thermoset or thermoplastic families of resins which can be fabricated in sheet form. The layer 14 is a relatively hard layer as in layer 14 of FIG. 1, e.g. a layer of non-metallic material such as a phenolic or melamine (thermoset resins), or a metal foil layer.

The layers 12A, 14 and 12B are bonded together. The sheet 10' can be fabricated by techniques similar to those described above for fabrication of the sheet 10. The sheet 10' is somewhat more expensive to fabricate, since two polymer layers 12A, 12B are employed, but provides the advantage that either side of the sheet can be laid against the printed circuit board prior to drilling operations.

Figure 4:
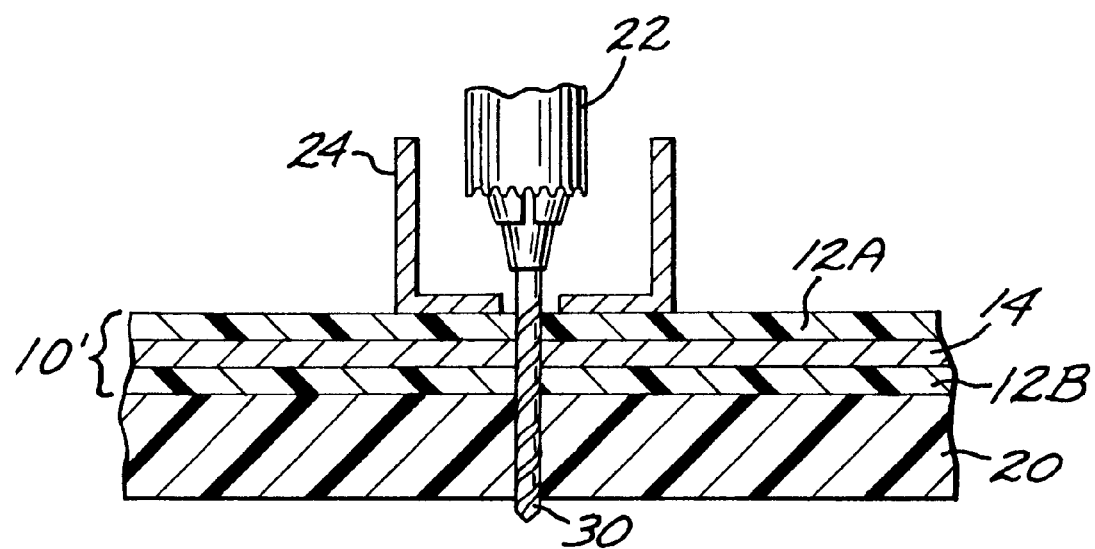
FIG. 4 illustrates the drilling of a hole in a printed circuit board using the entry overlay sheet of FIG. 3.

FIG. 4 illustrates a method of drilling a printed circuit board 20 employing the entry overlay sheet 10' in accordance with the invention. The drill bit 30 is carried by a drilling spindle 22, which typically includes a pressure foot 24. With the entry overlay sheet 10' placed on top of the printed circuit board 20, with the polymer layer 12A exposed and the polymer layer 12B disposed against the surface of the board 20, the spindle 22 and pressure foot 24 are lowered, the pressure foot 24 contacting the exposed surface of the layer 12A and securing it, and the rotating drill bit 30 is lowered or advanced into the material to be drilled. The layer 12A, layer 14, layer 12B and then the printed circuit board 20 are drilled in succession.

It is understood that the above-described embodiments are merely illustrative of the possible specific embodiments which may represent principles of the present invention. Other arrangements may readily be devised in accordance with these principles by those skilled in the art without departing from the scope and spirit of the invention.

What is claimed is:

1. A method for drilling a printed circuit board, comprising the steps of:

placing an entry overlay sheet on a surface of the printed circuit board, wherein the entry overlay sheet comprises a first thin layer comprising a polymer material having a thickness of about ten thousandths of an inch or smaller, a second thin layer of a hard material, and a third thin layer comprising a polymer material having a thickness of about ten thousandths of an inch or smaller, with the first layer and the third layer sandwiching therebetween the second layer; and drilling through the first thin layer, the second thin layer, the third thin layer and the printed circuit board in succession with a drilling tool.

2. The method of claim 1 wherein the first layer has a thickness in the range of three to eight thousandths of an inch.

3. The method of claim 1 wherein the second layer has a thickness in the range of three to twelve thousandths of an inch.

4. The method of claim 1 wherein the third layer has a thickness in the range of three to eight thousandths of an inch.

5. The method of claim 1 wherein the second layer is fabricated from a metal material.

6. The method of claim 1 wherein the second layer is a fabricated from aluminum or copper.

7. The method of claim 1 wherein the second layer is fabricated from a phenolic material.

8. The method of claim 1 wherein the second layer is fabricated from a melamine material.

9. The method of claim 1 wherein the first layer has a thickness in the range of three to eight thousandths of an inch, the second layer has a thickness in the range of three to twelve thousandths of an inch, the third layer has a thickness in the range of three to eight thousandths of an inch, and the entry overly sheet has a composite thickness in the range of nine to twenty-eight thousandths of an inch.

10. The method of claim 1 wherein the first layer is a homogeneous layer of a polymer material substantially free of inclusion of any foreign material.

11. The method of claim 1 wherein the polymer material of the first layer and the third layer is selected from the materials group consisting of nylon, polyester, cellulose triacetate, polyetherimid, polyphenylene oxide or polycarbonate.

12. The method of claim 1 wherein the polymer material is selected from the family of thermoset resins.

13. The method of claim 1 wherein the polymer material is selected from the family of thermoplastic materials.

14. An entry overlay sheet for facilitating drilling of holes in printed circuit boards, comprising:

a first thin layer of a polymer material having a thickness of about ten thousandths of an inch or smaller;

a second thin layer of a hard material having a thickness of about twelve thousandths of an inch or smaller;

a third thin layer of a polymer material having a thickness of about ten thousandths of an inch or smaller;

the first thin layer and third thin layer sandwiching therebetween the second layer, the third layer for application against the surface of the printed circuit board.

15. The sheet of claim 14 wherein the first layer has a thickness in the range of three to eight thousandths of an inch.

16. The sheet of claim 14 wherein the second layer has a thickness in the range of three to twelve thousandths of an inch.

17. The sheet of claim 14 wherein the third layer has a thickness in the range of three to eight thousandths of an inch.

18. The sheet of claim 14 wherein the second layer is fabricated from a metal material.

19. The sheet of claim 18 wherein the second layer is a fabricated from aluminum or copper.

20. The sheet of claim 14 wherein the second layer is fabricated from a phenolic material.

21. The sheet of claim 14 wherein the second layer is fabricated from a melamine material.

22. The sheet of claim 14 wherein the first layer has a thickness in the range of three to eight thousandths of an inch, the second layer has a thickness in the range of three to twelve thousandths of an inch, the third layer has a thickness in the range of three to eight thousandths of an inch, and the entry overly sheet has a composite thickness in the range of nine to twenty-eight thousandths of an inch.

23. The sheet of claim 14 wherein the first layer and the third layer are each a homogeneous layer of a polymer material substantially free of inclusion of any foreign material.

24. The sheet of claim 14 wherein the polymer material of the first layer is selected from the materials group consisting of nylon, polyester, cellulose triacetate, polyetherimid, polyphenylene oxide or polycarbonate.

25. The sheet of claim 14 wherein the polymer material is selected from the family of thermoset resins.

26. The sheet of claim 14 wherein the polymer material is selected from the family of thermoplastic materials.

* * * * *